United States Patent
Kim et al.

(10) Patent No.: US 11,646,319 B2
(45) Date of Patent: May 9, 2023

(54) POLYIMIDE SUBSTRATE INCLUDING INTAGLIO PATTERNS AND DISPLAY DEVICE INCLUDING THE SAME

(71) Applicant: LG Display Co., Ltd., Seoul (KR)

(72) Inventors: Sunghoon Kim, Gyeonggi-do (KR); Dongchae Shin, Gyeonggi-do (KR); KyungMo Son, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 113 days.

(21) Appl. No.: 17/109,941

(22) Filed: Dec. 2, 2020

(65) Prior Publication Data
US 2021/0183904 A1 Jun. 17, 2021

(30) Foreign Application Priority Data
Dec. 12, 2019 (KR) .................. 10-2019-0165224

(51) Int. Cl.
| | | |
|---|---|---|
| *H01L 27/12* | (2006.01) | |
| *H01L 27/15* | (2006.01) | |
| *H01L 27/32* | (2006.01) | |
| *H01L 25/16* | (2023.01) | |
| *H01L 25/07* | (2006.01) | |
| *H01L 51/00* | (2006.01) | |

(52) U.S. Cl.
CPC . *H01L 27/1218* (2013.01); *G09G 2300/0408* (2013.01); *G09G 2300/0804* (2013.01); *H01L 25/167* (2013.01); *H01L 27/156* (2013.01); *H01L 27/3244* (2013.01); *H01L 51/0097* (2013.01)

(58) Field of Classification Search
CPC ............ H01L 27/1218; H01L 27/156; H01L 27/3244; H01L 27/326; H01L 25/167; H01L 25/0753; H01L 51/0097; H01L 51/0096; H01L 2251/558; B32B 2379/08; G09G 2300/0408; G09G 2300/0804
See application file for complete search history.

(56) References Cited

U.S. PATENT DOCUMENTS 5,972,193 A * 10/1999 Chou ..................... H02K 3/26
 205/122
6,118,586 A * 9/2000 Tanabe ................ G02B 5/1833
 359/569
6,549,105 B2 * 4/2003 Takahashi ........... H01P 1/20363
 257/664

(Continued)

FOREIGN PATENT DOCUMENTS

| JP | S62-200324 A | 9/1987 |
| KR | 10-2008-0060794 A | 7/2008 |
| KR | 10-2016-0096760 A | 8/2016 |

*Primary Examiner* — Ida M Soward
(74) *Attorney, Agent, or Firm* — Seed IP Law Group LLP

(57) ABSTRACT

Embodiments of the disclosure are related to polyimide substrates and display devices, a plurality of intaglio patterns are formed on at least a portion of one surface of a polyimide substrate, a high transmissive filling is disposed inside the intaglio pattern, thus an overall transmittance of the polyimide substrate is enhanced. Furthermore, the filling having a certain range of a coefficient of thermal expansion is disposed in the intaglio pattern to maintain a heat resistance of the polyimide substrate, an element being required a high temperature process could be disposed on the polyimide substrate having an enhanced transmittance.

20 Claims, 8 Drawing Sheets

(56) References Cited

U.S. PATENT DOCUMENTS

| | | | |
|---|---|---|---|
| 8,040,477 B2 | 10/2011 | Lee et al. | |
| 9,634,074 B2 | 4/2017 | Son et al. | |
| 11,543,703 B2* | 1/2023 | Chen | G02F 1/1337 |
| 2005/0202348 A1* | 9/2005 | Nakayama | H01L 51/0096 |
| | | | 430/311 |
| 2014/0175405 A1* | 6/2014 | Yeh | H01L 51/5259 |
| | | | 438/115 |
| 2016/0204365 A1* | 7/2016 | Choi | H01L 51/56 |
| | | | 264/2.7 |
| 2017/0194392 A1* | 7/2017 | Wang | H01L 51/5253 |
| 2018/0149904 A1* | 5/2018 | Song | G09F 9/301 |
| 2018/0287099 A1* | 10/2018 | Uchida | H05B 33/24 |
| 2018/0323404 A1* | 11/2018 | Inoue | H01L 27/3248 |
| 2019/0067575 A1* | 2/2019 | Li | H01L 51/003 |
| 2019/0229229 A1* | 7/2019 | Chen | H01L 33/52 |
| 2020/0132989 A1* | 4/2020 | Park | G02B 27/0081 |
| 2021/0367199 A1* | 11/2021 | Li | H01L 51/56 |

\* cited by examiner (a) (b)

(a)        (b)        (c)

patterned area

POLYIMIDE SUBSTRATE INCLUDING INTAGLIO PATTERNS AND DISPLAY DEVICE INCLUDING THE SAME

CROSS REFERENCE TO RELATED APPLICATION

This application claims priority from Korean Patent Application No. 10-2019-0165224, filed Dec. 12, 2019, which is hereby incorporated by reference for all purposes as if fully set forth herein.

BACKGROUND

Technical Field

Embodiments of the disclosure are related to polyimide substrates and display devices.

Description of Related Art

The growth of the information society leads to increased demand for display devices to display images and use of various types of display devices, such as liquid crystal display devices, organic light emitting display devices, etc.

In addition, a display device may be implemented in various types, for example, the display device may be implemented as a transparent display device which has a high transmittance and appears transparent while not displaying an image.

It is beneficial to increase a transmittance of a substrate included in a display device to implement this transparent display device.

BRIEF SUMMARY

However, the inventors of the present disclosure have realized that when a substrate having a high transmittance is used, it is possible to affect a process of a display device due to a decrease in other characteristics (e.g., heat resistance, etc.). Accordingly, there are many technical difficulties in implementing a transparent display device. However, the inventors were able to provide a method to implement a transparent display device having a high transmittance by increasing a transmittance of a polyimide substrate included in a display device while maintaining a heat resistance of the polyimide substrate.

Embodiments of the disclosure provide a method to maintain a heat resistance of a polyimide substrate and increase a transmittance of the polyimide substrate in a process of a display device.

According to various embodiments of the disclosure, a display device comprises a polyimide substrate having a first transmittance, comprising a plurality of intaglio patterns located on at least a portion of one surface, and wherein a filling is disposed in the plurality of intaglio patterns and the filling has a second transmittance greater than the first transmittance, and a plurality of subpixels disposed on the polyimide substrate, comprising a light emission portion where a light emitting element is disposed, a circuit portion where a thin film transistor is disposed, and a transmission portion located on at least a portion of an area except for an area where the light emission portion and the circuit portion are disposed.

According to various embodiments of the disclosure, a display device comprises a polyimide substrate, and a plurality of subpixels disposed on the polyimide substrate, comprising a light emission portion where a light emitting element is disposed, a circuit portion where a thin film transistor is disposed, and a transmission portion located on at least a portion of an area except for an area where the light emission portion and the circuit portion are disposed, wherein a top surface of the polyimide substrate comprises a plurality of intaglio patterns located on at least a portion of an area overlapped with the transmission portion.

According to various embodiments of the disclosure, a polyimide substrate comprises a first portion having a first thickness and a first transmittance, and a plurality of second portion connected to the first portion, a portion corresponding to a second thickness smaller than the first thickness has the first transmittance, and the other portion corresponding to a third thickness excluding the second thickness from the first thickness has a second transmittance greater than the first transmittance.

According to various embodiments of the disclosure, an intaglio pattern is formed in one surface of a polyimide substrate, a filling having a higher transmittance than a colored polyimide and a lower coefficient of thermal expansion than a transparent polyimide is disposed in the intaglio pattern, thus a transmittance of the polyimide substrate could be enhanced while maintaining a heat resistance of the polyimide substrate.

According to various embodiments of the disclosure, a filling is disposed in an intaglio pattern of a polyimide substrate and a planarization process is performed, thus the polyimide substrate having high transmittance and heat resistance could be implemented in a process of a display device.

BRIEF DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
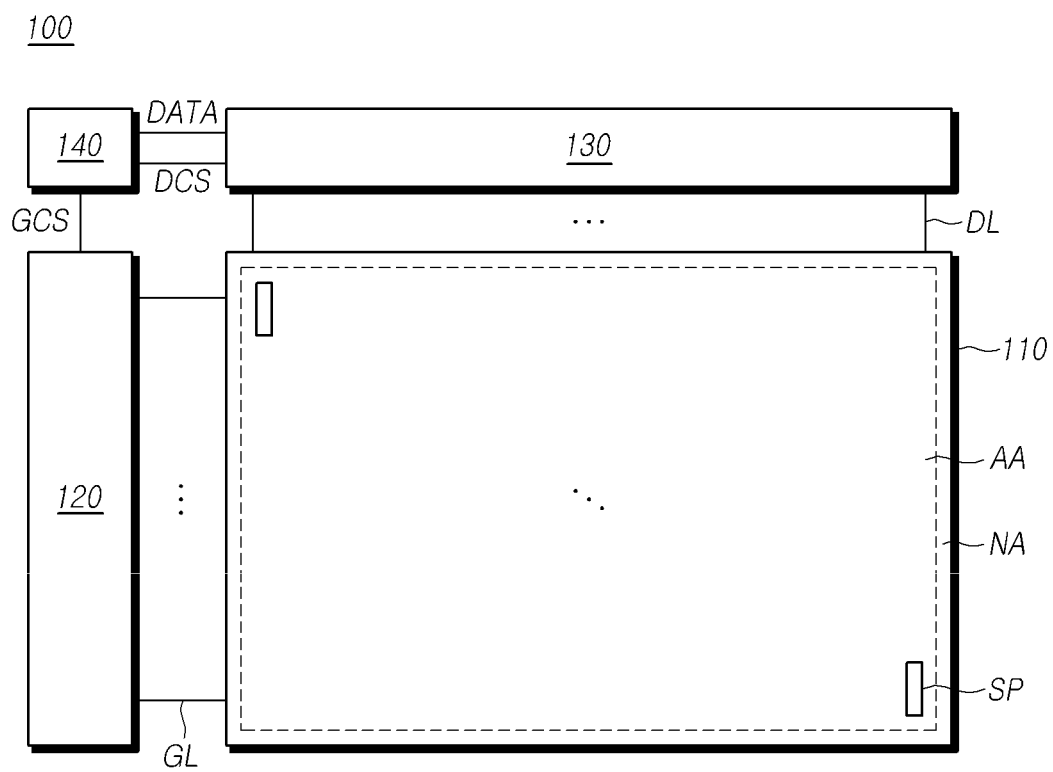
FIG. 1 is a view schematically illustrating a configuration of a display device according to various embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a view schematically illustrating a configuration of a display device 100 according to various embodiments of the disclosure.

Referring to FIG. 1, a display device 100 may include a display panel 110 including an active area AA and a non-active area NA, a gate driving circuit 120, a data driving circuit 130, and a controller 140 for driving the display panel 110.

The display panel 110 may include a plurality of gate lines GL, a plurality of data lines DL, and subpixels SP adjacent at the overlapping locations of the gate lines GL and the data lines DL.

The gate driving circuit 120 may be controlled by the controller 140 to sequentially output scan signals to the plurality of gate lines GL disposed in the display panel 110, controlling the driving timing of the subpixels SP.

The gate driving circuit 120 may include one or more gate driver integrated circuits (GDICs). Depending on driving schemes, the gate driving circuit 120 may be positioned on only one side, or each of two opposite sides, of the display panel 110.

Each gate driver integrated circuit (GDIC) may be connected to a bonding pad of the display panel 110 by a tape automated bonding (TAB) scheme or a chip on glass (COG) scheme, or may be directly disposed on the display panel 110 by implementing as a GIP (Gate In Panel) type, in some cases, may be integrated and disposed on the display panel 110. Furthermore, each gate driver integrated circuit (GDIC) may be implemented by a chip on film (COF) scheme which each gate driver integrated circuit (GDIC) is mounted on a film connected to the display panel 110.

The data driving circuit 130 receives image data from the controller 140 and converts the image data into an analog data voltage. The data driving circuit 130 outputs a data voltage to each data line DL according to the timing of applying a scan signal via the gate line GL, allowing each subpixel SP to represent a brightness according to the image data.

The data driving circuit 130 may include one or more source driver integrated circuits (SDICs).

Each source driver integrated circuit (SDIC) may include a shift register, a latch circuit, a digital to analog converter, an output buffer, and the like.

Each source driver integrated circuit (SDIC) may be connected to a bonding pad of the display panel 110 by a tape automated bonding (TAB) scheme or a chip on glass (COG) scheme, or may be directly disposed on the display panel 110, in some cases, may be integrated and disposed on the display panel 110. Furthermore, each source driver integrated circuit (SDIC) may be implemented by a chip on film (COF) scheme, in this case, each source driver integrated circuit (SDIC) may be mounted on a film connected to the display panel 110 and electrically connected to the display panel 110 through wires on the film.

The controller 140 supplies various control signals to the gate driving circuit 120 and the data driving circuit 130 and controls the operation of the gate driving circuit 120 and the data driving circuit 130.

The controller 140 is mounted on a printed circuit board, a flexible printed circuit, and the like, and electrically connected to the gate driving circuit 120 and the data driving circuit 130 through the printed circuit board, the flexible printed circuit, and the like.

The controller 140 enables the gate driving circuit 120 to output scan signals according to the timing of implementing each frame, converts image data received from the outside to meet the data signal format used by the data driving circuit 130, and outputs the resultant image data to the data driving circuit 130.

The controller 140 receives, from the outside (e.g., a host system), various timing signals including a vertical synchronization signal VSYNC, a horizontal synchronization signal HSYNC, an input data enable signal DE, and a clock signal, along with the image data.

The controller 140 may generate a diversity of control signals using the timing signals received from the outside and output the control signals to the gate driving circuit 120 and the data driving circuit 130.

As an example, to control the gate driving circuit 120, the controller 140 outputs various gate control signals GCS including a gate start pulse GSP, a gate shift clock GSC, and a gate output enable signal GOE.

The gate start pulse GSP controls the operation start timing of one or more gate driver integrated circuits (GDICs) constituting the gate driving circuit 120. The gate shift clock GSC is a clock signal commonly input to one or more gate driver integrated circuits (GDICs) and controls the shift timing of the scan signals. The gate output enable signal GOE designates timing information about one or more gate driver integrated circuits (GDICs).

To control the data driving circuit 130, the controller 140 outputs various data control signals DCS including, e.g., a source start pulse SSP, a source sampling clock SSC, and a source output enable signal SOE.

The source start pulse SSP controls the data sampling start timing of one or more source driver integrated circuits (SDICs) constituting the data driving circuit 130. The source sampling clock SSC is a clock signal for controlling the sampling timing of data in each source driver integrated circuit (SDIC). The source output enable signal SOE controls the output timing of the data driving circuit 130.

The display device 100 may further include a power management integrated circuit that supplies various voltages or currents to, e.g., the display panel 110, the gate driving circuit 120, and the data driving circuit 130 or controls various voltages or currents to be supplied.

Each of subpixels SPs is at an area adjacently formed at the crossings of the gate line GL and the data line DL. According to a type of the display device 100, a liquid crystal or a light emitting element may be disposed in the subpixel SP. The light emitting element, for example, may be an organic light emitting diode (OLED) or an inorganic light emitting diode (LED), in some cases, may be a micro light emitting diode (μLED) having a size of dozens of micrometers (μm).

And, the subpixel SP, may include a transparent area where a circuit element and the like is not disposed in an area except for an area where the circuit element or the light emitting element are not disposed. That is, when the display device 100 is a transparent display device, the subpixel SP may include the transparent area.

Figure 2:
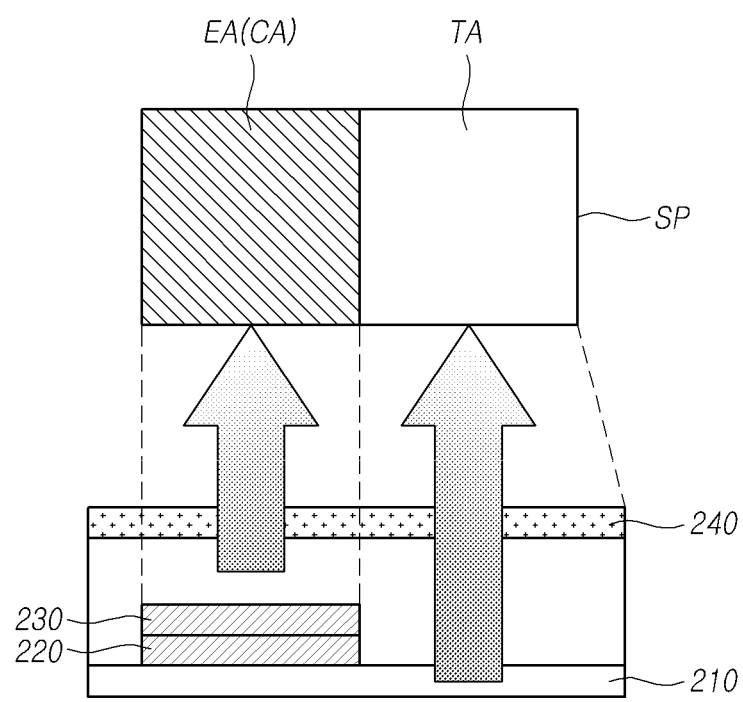
FIG. 2 is a view illustrating an example of a structure which a display device according to various embodiments of the disclosure is implemented as a transparent display device.

FIG. 2 is a view illustrating an example of a structure which a display device 100 according to various embodiments of the disclosure is implemented as a transparent display device.

Referring to FIG. 2, a thin film transistor layer 220 on where a plurality of thin film transistors for driving a light emitting element are disposed may be positioned on a lower substrate 210. An area where the thin film transistor is disposed may be regarded as a circuit portion CA on a plane.

A light emitting element layer 230 on where a plurality of light emitting elements are disposed may be positioned on the thin film transistor layer 220. An area where the light emitting element is disposed may be regarded as a light emitting portion EA on a plane.

The circuit portion CA and the light emitting portion EA, in some cases, may be overlapped with each other. However, in other cases, the circuit portion CA and the light emitting portion EA may not be overlapped with each other.

An upper substrate 240 may be disposed on the light emitting element layer 230.

Here, the subpixel SP may comprise a transmission portion TA positioned on an area except for an area where the circuit portion CA or the light emitting portion EA is disposed. That is, the transmission portion TA where the thin film transistor or the light emitting element is not disposed may be positioned in the subpixel SP.

And, in some cases, some of material except for an opaque electrode material constituting the thin film transistor or the light emitting element among material disposed on the thin film transistor layer 220 or the light emitting element layer 230 may be disposed on the transmission portion TA.

For example, some of material having a high transmittance among insulation layers disposed on the thin film transistor layer 220 or the light emitting element layer 230 may be disposed on the transmission portion TA. Alternatively, some of transparent electrodes among electrodes constituting the light emitting element included in the light emitting element layer 230 may be disposed on the transmission portion TA.

In this way, since the transmission portion TA is an area where an opaque material constituting the thin film transistor or the like is not disposed, in some cases, it may be a transparent area, or an area having high transmittance.

Accordingly, a transparent display device may be implemented since a light entered to a bottom surface of the lower substrate 210 may penetrate the transmission portion TA and be output on the upper substrate 240.

At this point, a transparent display device may be implemented by not disposing material being opaque or material having low transmittance on the transmission portion TA of the subpixel SP, but a transmittance of the transmission portion TA may be affected as the lower substrate 210 and the upper substrate 240 or the like are disposed on the transmission portion TA.

Here, it may be possible to dispose the upper substrate 240 as a transparent substrate, but it may be difficult to dispose the lower substrate 210 as a transparent substrate since a heat resistance may be beneficial during a process for placing a thin film transistor or the like on the lower substrate 210.

According to various embodiments of the disclosure, by maintaining a heat resistance of a substrate and enhancing a transmittance of the substrate, a method is provided to implement the substrate applicable to a transparent display device.

Figure 3:
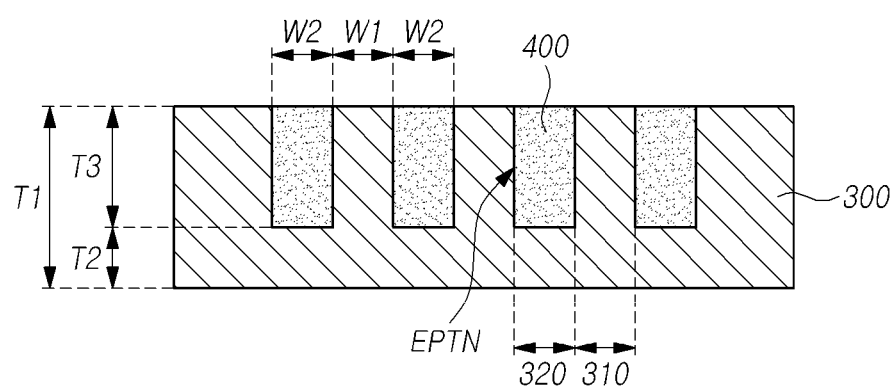
FIG. 3 is a view illustrating an example of a structure of a polyimide substrate according to various embodiments of the disclosure.

FIG. 3 is a view illustrating an example of a structure of a polyimide substrate 300 according to various embodiments of the disclosure.

Referring to FIG. 3, one surface of the polyimide substrate 300 may comprise a plurality of intaglio patterns EPTNs positioned on at least part area of the one surface. And the intaglio pattern EPTN may be formed by a process to etch a part of the one surface of the polyimide substrate 300. The intaglio pattern EPTN as used herein is used to broadly encompass shapes or patterns that has ridges or valleys. The valley portion of the intaglio pattern EPTN may be later filled in with various materials. In some cases, the intaglio pattern EPTN may have grooves that are protruded inwards in the polyimide substrate 300. In other cases, the intaglio pattern EPTN may have square wave-like or rectangular wave-like patterns.

Here, the polyimide substrate 300 may be a substrate which is used as the lower substrate 210 in the display device 100.

Accordingly, a thin film transistor or the like may be disposed on the polyimide substrate 300. And in cast that the thin film transistor, for example, comprises an active layer comprising a polycrystalline silicon, a high temperature heat processing may be performed in a process to form the thin film transistor.

Thus, the polyimide substrate 300 may be made of a material having good heat resistance, and a transmittance of the polyimide substrate 300 may not be high relatively.

As the plurality of intaglio patterns EPTNs is formed on one surface of the polyimide substrate 300 and a part of portion having low transmittance is removed, a transmittance of the polyimide substrate 300 may be increased.

Furthermore, a filling 400 which has a higher transmittance than that of the polyimide substrate 300 may be disposed in the intaglio pattern EPTN formed on one surface of the polyimide substrate 300.

For example, in case that a transmittance of the polyimide substrate 300 is 50%, a transmittance of the filling 400 disposed in the intaglio pattern EPTN of the polyimide substrate 300 may be greater than 50%.

As a part of the polyimide substrate 300 which does not have a high transmittance is removed and the filling 400 having a high transmittance is disposed in the intaglio pattern EPTN, an overall transmittance of the polyimide substrate 300 may be increased.

And even though the filling 400 having a high transmittance is disposed in the intaglio pattern EPTN, a coefficient of thermal expansion of the filling 400 may be included in a certain range to maintain a heat resistance of the polyimide substrate 300.

For example, a coefficient of thermal expansion of the filling 400 may be greater than a coefficient of thermal expansion of the polyimide substrate 300 (e.g., 4 ppm/° C.), and may be smaller than a coefficient of thermal expansion of a transparent polyimide (e.g., 40 ppm/° C.). Here, the transparent polyimide may mean a polyimide having much higher transmittance (e.g., 89%) than the polyimide substrate 300 or the filling 400. That is, a coefficient of thermal expansion of the filling 400 may be smaller than a coefficient of thermal expansion of polyimide having a transmittance greater than a certain level or more (e.g., transmittance is close to 100%).

An overall transmittance of the polyimide substrate 300 is increased as the filling 400 having a high transmittance in the intaglio pattern EPTN of the polyimide substrate 300 is disposed, furthermore a heat resistance of the polyimide substrate 300 may be maintained as a coefficient of thermal expansion of the filling 400 is included in a certain range.

As examples of a material that satisfies conditions of above-mentioned transmittance and coefficient of thermal expansion, the material may be $SiO_2$, $SiN_x$, Siloxan, Boron Oxide, Zinc Oxide, Indium Oxide, Fluorine Oxide.

Accordingly, these materials may be used as the filling 400, but not limited to these. Like above-mentioned, all materials that have a higher transmittance than the polyimide substrate 300 and a coefficient of thermal expansion included in a certain range may be used as the filling 400.

And a material used as the filling 400, in some cases, may be a same material with at least one insulation layer among insulation layers disposed on the polyimide substrate 300. For example, in case that $SiO_2$ or $SiN_x$ is used as the filling 400, an insulation layer made of a same material with the filling 400 may exist among insulation layers disposed on the polyimide substrate 300.

As the filling 400 having a high transmittance and satisfying a certain coefficient of thermal expansion is disposed in the intaglio pattern EPTN of the polyimide substrate 300, the polyimide substrate 300 may comprise a portion having a constant transmittance and a portion that materials having different transmittance are stacked.

The polyimide substrate 300 may comprise a first portion 310 having a first transmittance. A thickness of the first portion 310 may be T1, T1 may be an entire thickness of the polyimide substrate 300.

And the polyimide substrate 300 may comprise a second portion 320 which is connected to the first portion 310 and is that a portion having the first transmittance and a portion having a second transmittance greater than the first transmittance are stacked.

For example, a portion corresponding to a thickness T2 of an entire thickness T1 of the polyimide substrate 300 in the second portion 320 may have the first transmittance. And a portion corresponding to a thickness T3 excluding the thickness T2 from the thickness T1 may have the second transmittance.

Here, the thickness T3 may greater than the thickness T2. That is, a depth of the intaglio pattern EPTN where the filling 400 having a high transmittance is disposed may be greater than a thickness of a remaining portion after the polyimide substrate 300 is etched.

As the second portion 320 which is a part of the polyimide substrate 300 has a stacked structure of materials having different transmittances, an overall transmittance of the polyimide substrate 300 may be increased. And by increasing a ratio that a thickness of a portion which the filling 400 having a high transmittance is disposed possess in a thickness of the second portion 320, an increase of an overall transmittance of the polyimide substrate 300 may be increased or maximized.

Here, a width of the first portion 310 of the polyimide substrate 300 may be constant as W1. That is, a distance between the intaglio pattern EPTN may be constant. For example, the distance between neighboring intaglio patterns EPTN may have a constant distance W1. Furthermore, a width of the second portion 320 of the polyimide substrate 300 may be constant as W2. For example, the width of each intaglio patterns EPTN may have a constant distance W2. Accordingly, in some embodiments, a width, an area, or a shape of the intaglio pattern EPTN may be constant.

However, in other embodiments, other dimensions, sizes, shapes of the intaglio pattern EPTN may be utilized. For example, each of the intaglio patterns EPTN may be formed as a different shape (e.g., each of the intaglio patterns EPTN may have a different shape from each other). Further, a distance between the intaglio patterns EPTN may be spaced apart from each other at a different distance.

As the filling 400 having a different transmittance with the polyimide substrate 300 is disposed as a constant shape and a constant distance, it may be prevented that the filling 400 disposed in the intaglio pattern EPTN of the polyimide substrate 300 is recognized visually.

In this way, according to various embodiments of the disclosure, as the intaglio pattern EPTN is formed on one surface of the polyimide substrate 300 and the filling 400 having a high transmittance and a coefficient of thermal expansion in a certain range is disposed in the intaglio pattern EPTN, a heat resistance of the polyimide substrate 300 may be maintained while an overall transmittance of the polyimide substrate 300 is increased.

And this polyimide substrate 300 may be implemented in a process of the display device 100.

Figure 4:
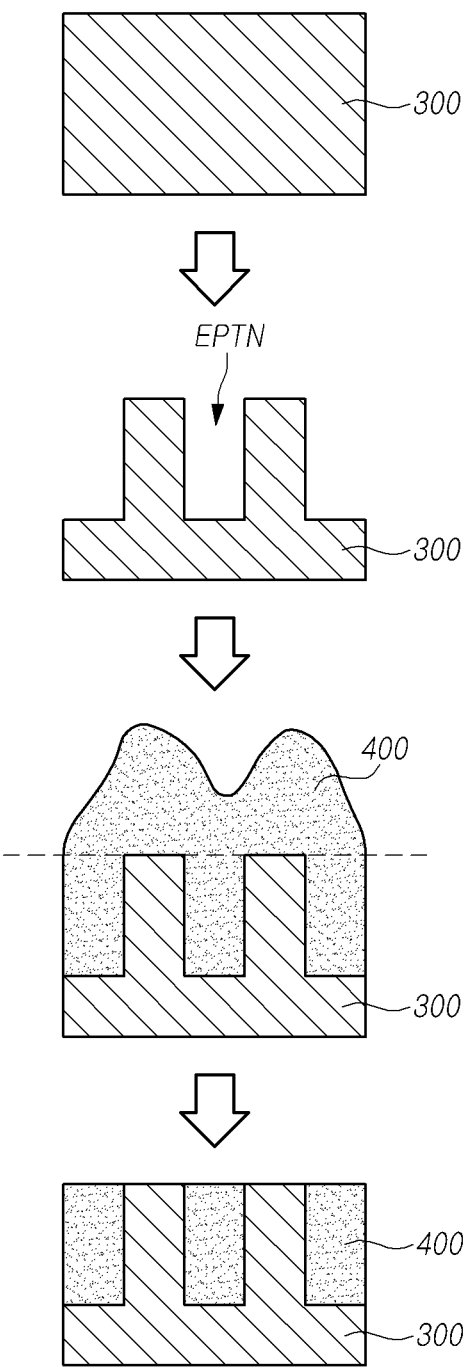
FIG. 4 is a view illustrating an example of a process scheme of a polyimide substrate according to various embodiments of the disclosure.

FIG. 4 is a view illustrating an example of a process scheme of the polyimide substrate 300 according to various embodiments of the disclosure.

Referring to FIG. 4, after coating the polyimide substrate 300, the plurality of intaglio patterns EPTNs may be formed by etching a part of one surface of the polyimide substrate 300. The intaglio pattern EPTN may be formed as a constant shape (e.g., each of the intaglio patterns EPTN may have a same or substantially the same shape as each other), a distance between the intaglio patterns EPTN may be constant (e.g., the distance between the intaglio patterns EPTN may be equally spaced apart).

The filling 400 having a high transmittance and a certain coefficient of thermal expansion is disposed on one surface of the polyimide substrate 300. Accordingly, the filling 400 may be disposed on one surface of the polyimide substrate 300 and be filled in the intaglio pattern EPTN formed on the polyimide substrate 300.

After the filling 400 is disposed on the polyimide substrate 300, a top surface of the filling 400 disposed on the polyimide substrate 300 may be flatten by performing a planarization process like as a chemical mechanical polishing (CMP) process.

Here, a top surface of the filling 400 may be positioned on a same plane with a top surface of a portion where the intaglio pattern EPTN is not disposed in a top surface of the polyimide substrate 300 (e.g., a top surface of the filling 400 may be coplanar or substantially coplanar with a top surface of a portion where the intaglio pattern EPTN is not disposed in a top surface of the polyimide substrate 300). That is, the top surface of the filling 400 may be flatten based on a portion where the intaglio pattern EPTN is not formed, it may be a shape that the filling 400 is filled in the intaglio pattern EPTN formed on the polyimide substrate 300.

In this way, as the intaglio pattern EPTN is formed on one surface of the polyimide substrate 300 and the filling 400 having a high transmittance and a certain heat resistance in the intaglio pattern EPTN, a transmittance of the polyimide substrate 300 may be enhanced while maintaining a heat resistance of the polyimide substrate 300.

Furthermore, as top surfaces of the polyimide substrate 300 and the filling 400 are flatten after the filling 400 is disposed on the polyimide substrate 300, processes that insulation layers and various elements or the like are disposed on the polyimide substrate 300 which the intaglio pattern EPTN is formed may be performed easily.

Alternatively, in some cases, a planarization process may be performed for a part of the filling 400 to be disposed on a periphery area of the intaglio pattern EPTN on a top surface of the polyimide substrate 300.

Figure 5:
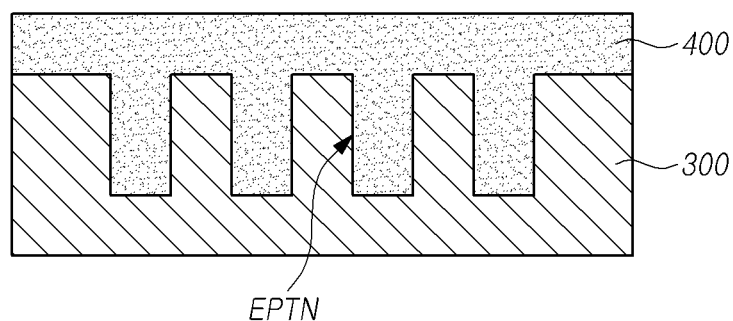
FIG. 5 is a view illustrating other example of a structure of a polyimide substrate according to various embodiments of the disclosure.

FIG. 5 is a view illustrating other example of a structure of the polyimide substrate 300 according to various embodiments of the disclosure.

Referring to FIG. 5, the plurality of intaglio pattern EPTN may be disposed on at least a part area of the polyimide substrate 300. And the filling 400 may be disposed in the intaglio pattern EPTN of the polyimide substrate 300.

Furthermore, the filling 400 may be disposed on a periphery area of the intaglio pattern EPTN of the polyimide substrate 300 and be disposed on a top surface of the polyimide substrate 300.

That is, like as illustrated in FIG. 5, the filling 400 may be disposed in the intaglio pattern EPTN of the polyimide substrate 300 and be disposed on the polyimide substrate 300 more.

In an above-mentioned process referring to FIG. 4, as configuring a flattened height differently when performing a planarization process after disposing the filling 400 on the polyimide substrate 300 which the intaglio pattern EPTN is formed, a structure that a part of the filling 400 is disposed on the polyimide substrate 300 may be formed.

Since a transmittance of the filling 400 is higher than that of the polyimide substrate 300, even though the filling 400 is disposed on the polyimide substrate 300 overall, an overall transmittance of the polyimide substrate 300 may not be reduced.

And a thickness of insulation layers disposed on the polyimide substrate 300 may be reduced as a part of the filling 400 is disposed on the polyimide substrate 300.

For example, in case that a thin film transistor is disposed on the polyimide substrate 300, an insulation layer like as a buffer layer may be disposed on the polyimide substrate 300 before disposing an electrode layer constituting the thin film transistor on the polyimide substrate 300. And a thickness of the buffer layer disposed on the polyimide substrate 300 may be equal or greater than a certain thickness for a convenience of a process.

As the filling 400 is disposed on the polyimide substrate 300 and provides a function of the buffer layer, a thickness of the buffer layer disposed on the polyimide substrate 300 may be reduced.

Furthermore, in a case that the intaglio pattern EPTN is formed deeply to increase a transmittance of the polyimide substrate 300 more, a hardness of the polyimide substrate 300 may be weaken since a thickness of the polyimide substrate 300 on an area where the intaglio pattern EPTN is disposed is thin.

As the filling 400 disposed on the polyimide substrate 300 is disposed as being meshed with the polyimide substrate 300, a hardness of the polyimide substrate 300 may be compensated.

In this way, as the filling 400 is disposed in the intaglio pattern EPTN of the polyimide substrate 300 or an area including the intaglio pattern EPTN and a periphery area of that, a heat resistance of a polyimide substrate 300 may be maintained in a certain range while enhancing a transmittance of the polyimide substrate 300.

And a shape of the intaglio pattern EPTN formed on the polyimide substrate 300 may be various. Furthermore, an area where the intaglio pattern EPTN is disposed may be various according to types of the display device 100.

Figure 6A:
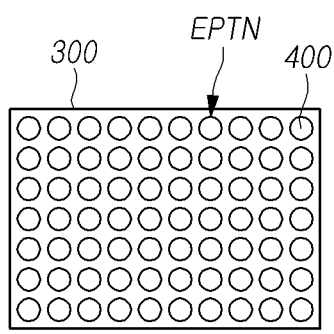
FIGS. 6A, 6B, and 6C are views illustrating an example of a shape of an intaglio pattern included in a polyimide substrate according to various embodiments of the disclosure.
Figure 6B:
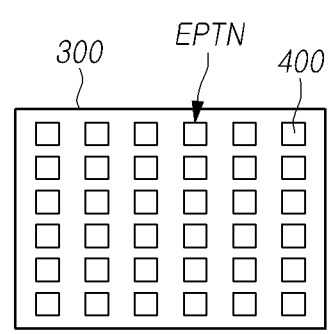
Figure 6C:
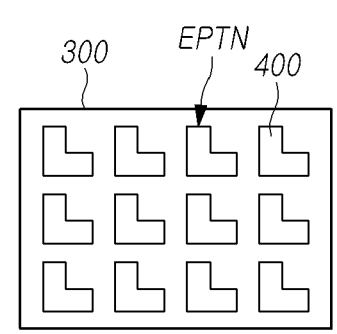

FIGS. 6A, 6B, and 6C are views illustrating an example of a shape of the intaglio pattern EPTN included in the polyimide substrate 300 according to various embodiments of the disclosure. FIGS. 6A, 6B, and 6C illustrate an example of a plane structure that the filling 400 is disposed in the intaglio pattern EPTN formed on the polyimide substrate 300 and the filling 400 is flatten for top surfaces of the filling 400 and the polyimide substrate 300 to be positioned on a same plane.

Referring to FIGS. 6A, 6B, and 6C, the plurality of intaglio pattern EPTN formed on one surface of the polyimide substrate 300 may have various shapes, but they may be formed as constant shapes on a same polyimide substrate 300.

For example, like as an example illustrated in FIG. 6A, the intaglio pattern EPTN formed on one surface of the polyimide substrate 300 may be a circle shape. Alternatively, like as an example illustrate in FIG. 6B, the intaglio pattern EPTN formed on one surface of the polyimide substrate 300 may be a quadrangle shape. Alternatively, like as an example illustrate in FIG. 6C, the intaglio pattern EPTN formed on one surface of the polyimide substrate 300 may be "L" shape.

Alternatively, besides above-mentioned examples, shapes of the intaglio pattern EPTN formed on one surface of the polyimide substrate 300 may be various.

Shapes of the intaglio pattern EPTN formed on one surface of the polyimide substrate 300 may be configured variously considering a convenience of etching process, or a ratio of an area where the filling 400 is disposed, or the like.

And the plurality of the intaglio pattern EPTN may have same shapes to prevent that the intaglio pattern EPTN formed on the polyimide substrate 300 and the filling 400 disposed in the intaglio pattern EPTN are recognized as spots. Furthermore, distances between the intaglio pattern EPTN may be constant.

That is, although shapes and distances of the intaglio pattern EPTN where the filling 400 is disposed on one surface of the polyimide substrate 300 may be configured to consider a process convenience and a transmittance or the like, they may be configured that the intaglio pattern EPTN having constant shapes is disposed on the polyimide substrate 300 as constant distances.

Furthermore, the intaglio pattern EPTN formed on the polyimide substrate 300 may be disposed on the polyimide substrate 300 overall, in some cases, be disposed on a part area.

Figure 7:
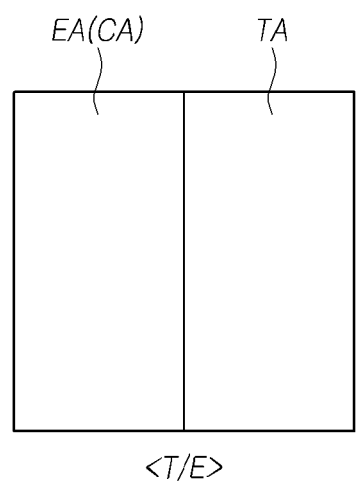
FIGS. 7 and 8 are views illustrating examples of areas where an intaglio pattern is disposed in a polyimide substrate according types of a display device.
Figure 7:
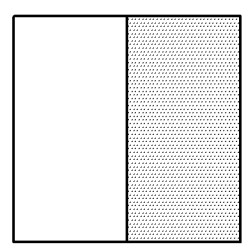
Figure 7:
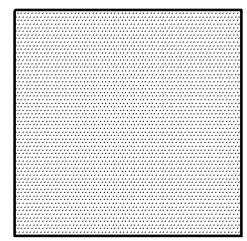
Figure 7:
Figure 8:
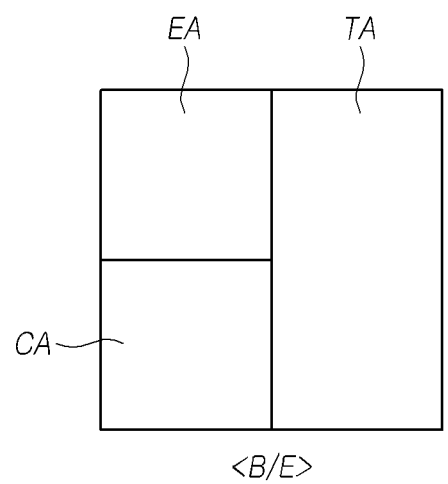
Figure 8:
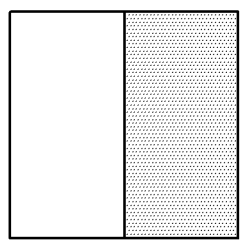
Figure 8:
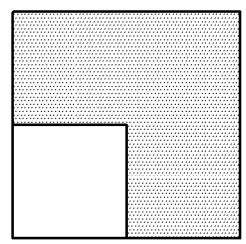
Figure 8:
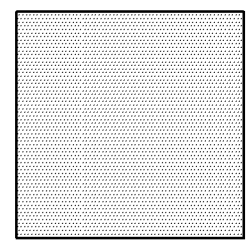
Figure 8:

FIGS. 7 and 8 are views illustrating examples of areas where the intaglio pattern EPTN is disposed in the polyimide substrate 300 according types of the display device 100.

FIG. 7 illustrates an example of an area where the intaglio pattern EPTN is disposed in a case that the display device 100 is a top emission structure, and FIG. 8 illustrates an example of an area where the intaglio pattern EPTN is disposed in a case that the display device 100 is a bottom emission structure.

Referring to FIG. 7, in a case that the display device 100 has a top emission structure, the light emitting portion EA and the circuit portion CA may be disposed to be overlapped in the subpixel SP to increase or maximize the transmission portion TA included in the subpixel SP.

That is, a light emitting element included in the light emitting portion EA may be positioned on a thin film transistor included in the circuit portion CA. And an area except for an area where the light emitting portion EA and the circuit portion CA are overlapped is an area where an element or the like is not disposed, and the area may constitute the transmission portion TA.

In this case, the intaglio pattern EPTN formed on one surface of the polyimide substrate 300, like as an example illustrated in (a) of FIG. 7, may be positioned on an area overlapped to the transmission portion TA. And the intaglio pattern EPTN may not be positioned on an area overlapped to the light emitting portion EA and the circuit portion CA.

Since the light emitting portion EA and the circuit portion CA are not areas to affect a transmittance of the display device 100, even if the intaglio pattern EPTN where the filling 400 is disposed is not positioned on an area overlapped to the light emitting portion EA and the circuit portion CA, it may not affect the transmittance of the display device 100.

And as the intaglio pattern EPTN where the filling 400 having a high transmittance is disposed is positioned on an area overlapped to the transmission portion TA, a transmittance of the display device 100 may be increased.

In this way, as limiting a pattern area where the intaglio pattern EPTN is formed on the polyimide substrate 300 to an area corresponding to the transmission portion TA of the subpixel SP, a transmittance of the display device 100 may be improved while reducing or minimizing a process forming the intaglio pattern EPTN on the polyimide substrate 300.

And in a case that the intaglio pattern EPTN of the polyimide substrate 300 is disposed on an area corresponding to the transmission portion TA only, a process for disposing the filling 400 in the intaglio pattern EPTN may not be performed.

That is, since only some insulation layers may be disposed on the transmission portion TA and elements or the like may not be disposed on the transmission portion TA, an inside of the intaglio pattern EPTN may be filled by insulation layers or the like disposed on a part area of the polyimide substrate 300 which the intaglio pattern EPTN is formed.

Furthermore, since a part area of the polyimide substrate 300 positioned on an area corresponding to the light emitting portion EA and the circuit portion CA may not include the intaglio pattern EPTN, a process for disposing insulation layers and various elements on that area may be performed.

Alternatively, like as an example above-mentioned referring to FIG. 5, the intaglio pattern EPTN may be formed on an area corresponding to the transmission portion TA only, the filling 400 may be disposed in the intaglio pattern EPTN and a periphery area of the intaglio pattern EPTN.

Accordingly, the filling 400 may be disposed also as a constant thickness on an area where the intaglio pattern EPTN is not disposed, such as an area corresponding to the light emitting portion EA and the circuit portion CA.

Alternatively, like as an example illustrated in (b) of FIG. 7, the intaglio pattern EPTN may be formed overall on an area corresponding to the light emitting portion EA, the circuit portion CA and the transmission portion TA in the polyimide substrate 300.

Even in a case that the intaglio pattern EPTN is formed on the polyimide substrate 300 overall, as the filling 400 is disposed in the intaglio pattern EPTN, a process for disposing an element like as a thin film transistor on the polyimide substrate 300 may be performed easily.

And in a case that the display device 100 is a bottom emission structure, positions of a pattern area where the intaglio pattern EPTN is formed on one surface of the polyimide substrate 300 may be more various.

Referring to FIG. 8, in a case that the display device 100 has a bottom emission structure, the light emitting portion EA may not be overlapped with the circuit portion CA in each subpixel SP. That is, an opaque circuit portion CA may be positioned not to be overlapped with the light emitting portion EA, since a light emitted from the light emitting portion EA should be output through a bottom of the display device 100.

And the transmission portion TA may be position on area except for an area where the light emitting portion EA and the circuit portion CA in the subpixel SP.

In this case, the intaglio pattern EPTN formed on one surface of the polyimide substrate 300, like as an example illustrated in (a) of FIG. 8, may be positioned on an area overlapped with the transmission portion TA. Alternatively, like as an example illustrated in (b) of FIG. 8, the intaglio pattern EPTN may be positioned on an area overlapped with the transmission portion TA and the light emitting portion EA. Alternatively, like as an example illustrated in (c) of FIG. 8, the intaglio pattern EPTN may be positioned on the polyimide substrate 300 overall.

Such as (a) of FIG. 8, in a case that the intaglio pattern EPTN formed on one surface of the polyimide substrate 300 is positioned on an area corresponding to the transmission portion TA only, a transmittance of the transmission portion TA may be increased by the intaglio pattern EPTN and the filling 400 filled in the intaglio pattern EPTN.

And in this case, such as above-mentioned, a process for disposing the filling 400 in the intaglio pattern EPTN may not be performed.

Alternatively, after disposing the filling 400, a planarization process may be performed for a part of the filling 400 to be positioned on an area besides of the intaglio pattern EPTN. In this case, a thickness of an insulation layer disposed on the polyimide substrate 300, like as a buffer layer or the like, may be reduced, since the filling 400 is disposed on the light emitting portion EA, the circuit portion CA and the transmission portion TA overall.

Such as (b) of FIG. 8, in a case that the intaglio pattern EPTN of the polyimide substrate 300 is positioned to be corresponded to the light emitting portion EA and the transmission portion TA, a transmittance of the display device 100 may be increased.

Furthermore, since a transmittance of an area corresponding to the light emitting portion EA of the subpixel SP may be increased also, an efficiency of a light emitted through a bottom of the polyimide substrate 300 may be increased also.

A transmittance of the display device 100 may be improved by increasing a transmittance of the polyimide substrate 300, and at the same time, a light efficiency of the display device 100 having a structure that a light is emitted through the polyimide substrate 300 may be enhanced also.

Alternatively, such as (c) of FIG. 8, as forming the intaglio pattern EPTN on an area corresponding to the circuit portion CA as well as an area corresponding to the transmission portion TA and the light emitting portion EA, a process may be simplified by forming the intaglio pattern EPTN on the polyimide substrate 300 overall.

According to various embodiments of the disclosure, as forming the intaglio pattern EPTN on one surface of the polyimide substrate 300 having a low transmittance and a high heat resistance, a transmittance of the polyimide substrate 300 may be increased.

Furthermore, as disposing the filling 400 having a higher transmittance than the polyimide substrate 300 and a coefficient of thermal expansion of a certain range in the intaglio pattern EPTN of the polyimide substrate 300, a heat resistance of the polyimide substrate 300 may be maintained while increasing a transmittance of the polyimide substrate 300.

Accordingly, elements that a high temperature heat process is required may be disposed on the polyimide substrate 300 which increases a transmittance of the polyimide substrate 300.

Furthermore, in some cases, as disposing a part of the filling 400 on the polyimide substrate 300, a thickness of an insulation layer or the like disposed on the polyimide substrate 300 may be reduced.

And according to types of the display device 100, as the intaglio pattern EPTN of the polyimide substrate 300 is disposed on an area corresponding to the transmission portion TA only, or is disposed on an area corresponding to the light emitting portion EA more, a transmittance or a light efficiency of the display device 100 may be improved.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the coverage provided by the present disclosure is not limited to the embodiments shown, but is to be accorded the widest scope consistent with the claims. The scope of protection should be construed based on the following claims, and all technical ideas within the scope of the present disclosure should be construed as being included within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a polyimide substrate having a first transmittance, including a plurality of intaglio patterns located on at least a portion of one surface;
a filling disposed in the plurality of intaglio patterns, the filling having a second transmittance greater than the first transmittance; and
a plurality of subpixels disposed on the polyimide substrate, including a light emission portion where a light emitting element layer is disposed, a circuit portion where a thin film transistor layer is disposed, and a transmission portion located on at least a portion of an area except for an area where the light emission portion and the circuit portion are disposed.

2. The display device of claim 1, wherein the plurality of intaglio patterns are disposed on an area including an area overlapping with the transmission portion.

3. The display device of claim 1, wherein the plurality of intaglio patterns are disposed on an area except for an area overlapping with at least one of the light emission portion and the circuit portion.

4. The display device of claim 1, wherein at least a part of the light emitting element is disposed on an area overlapping with the thin film transistor, and
the plurality of intaglio patterns are disposed on an area except for an area overlapping with the light emission portion and the circuit portion.

5. The display device of claim 1, wherein a light emitted from the light emitting element is output through a bottom surface of the polyimide substrate, and
the plurality of intaglio patterns are disposed on an area including an area overlapping with the light emission portion and the transmission portion.

6. The display device of claim 1, wherein shapes and sizes of the plurality of intaglio patterns are constant, and distances between the plurality of intaglio patterns are constant.

7. The display device of claim 1, wherein a thickness of the filling is greater than a value that a thickness of the polyimide substrate minus a depth of the intaglio pattern.

8. The display device of claim 1, wherein a coefficient of thermal expansion of the filling is greater than a coefficient of thermal expansion of the polyimide substrate and smaller than a coefficient of thermal expansion of a transparent polyimide.

9. The display device of claim 1, wherein a top surface of the filling is located on a same plane with a surface of an area except for an area where the intaglio pattern is located.

10. The display device of claim 1, wherein the filling is disposed on a periphery area of the intaglio pattern more, and a top surface of the filling is flat.

11. The display device of claim 1, further comprising:
at least one insulation layer located on at least a portion of the transmission portion, and including same or substantially the same material with the filling.

12. The display device of claim 1, wherein an active layer included in the thin film transistor comprises polycrystalline silicon.

13. A display device, comprising:
a polyimide substrate; and
a plurality of subpixels disposed on the polyimide substrate, including a light emission portion where a light emitting element layer is disposed, a circuit portion where a thin film transistor layer is disposed, and a transmission portion located on at least a portion of an area except for an area where the light emission portion and the circuit portion are disposed,
wherein a top surface of the polyimide substrate comprises a plurality of intaglio patterns located on at least a portion of an area overlapped with the transmission portion.

14. The display device of claim 13, further comprising:
a filling disposed inside the intaglio pattern, having a transmittance greater than a transmittance of the polyimide substrate.

15. The display device of claim 14, wherein a top surface of the filling and the top surface of the polyimide substrate are coplanar with each other.

16. The display device of claim 13, wherein the plurality of intaglio patterns are located on at least a portion of an area overlapped with the light emission portion and the circuit portion more.

17. A polyimide substrate, comprising:
a first portion having a first thickness and a first transmittance; and
a plurality of second portions connected to the first portion, a portion corresponding to a second thickness smaller than the first thickness has the first transmittance, and the other portion corresponding to a third thickness excluding the second thickness from the first thickness has a second transmittance greater than the first transmittance,
wherein a second portion of the plurality of second portions has a constant second thickness.

18. The polyimide substrate of claim 17, wherein a portion having the first transmittance of the first portion and the second portions have a first coefficient of thermal expansion, a portion having the second transmittance has a second coefficient of thermal expansion greater than the first coefficient of thermal expansion, and the second coefficient of thermal expansion is smaller than a coefficient of thermal expansion of a transparent polyimide.

19. The polyimide substrate of claim 17, wherein a width of the second portion is equal to or greater than a width of the first portion.

20. The polyimide substrate of claim 17, wherein a width of each second portion of the plurality is constant.

* * * * *